United States Patent [19]

Sato

[11] Patent Number: 5,500,554
[45] Date of Patent: Mar. 19, 1996

[54] BIPOLAR TRANSISTOR HAVING REDUCED BASE-COLLECTOR CAPACITANCE WHILE MAINTAINING IMPROVED CUT-OFF FREQUENCY

[75] Inventor: Fumihiko Sato, Tokyo, Japan

[73] Assignee: NEC Corporation, Japan

[21] Appl. No.: 364,964

[22] Filed: Dec. 28, 1994

[30] Foreign Application Priority Data

Dec. 28, 1993 [JP] Japan ..................... 5-336646

[51] Int. Cl.$^6$ .......................... H01L 27/082; H01L 29/41
[52] U.S. Cl. ....................... 257/588; 257/593; 257/756
[58] Field of Search .................................... 257/587, 588, 257/593, 756

[56] References Cited

U.S. PATENT DOCUMENTS 5,101,256  3/1992  Harame et al. ..................... 257/588
5,235,206  8/1993  Desilets et al. ..................... 257/588
5,321,301  6/1994  Sato et al. ......................... 257/588
5,374,846  12/1994 Takemura ........................... 257/588

FOREIGN PATENT DOCUMENTS 4-330730  11/1992  Japan .

Primary Examiner—Rolf Hille
Assistant Examiner—David B. Hardy

[57] ABSTRACT

A bipolar transistor with a structure such that it is possible to reduce the parasitic capacity without sacrificing improvements in cut-off frequency $f_T$, in which a P$^+$-type polycrystalline silicon film 122A is provided on the side wall of an opening 143A which is provided in a silicon nitride film 152A serving as the middle layer of a laminated insulation film 107A, and, a P-type single crystal silicon layer 121A constituting the intrinsic base region is connected to a P$^+$-type polycrystalline silicon film 111 which is a base drawing electrode via a thin P$^+$-type polycrystalline silicon film 123A.

12 Claims, 6 Drawing Sheets

# BIPOLAR TRANSISTOR HAVING REDUCED BASE-COLLECTOR CAPACITANCE WHILE MAINTAINING IMPROVED CUT-OFF FREQUENCY

FIELD OF THE INVENTION

The present invention relates to a semiconductor device, and in particular relates to a semiconductor device including vertical type bipolar transistors.

BACKGROUND OF THE INVENTION

It is known that in bipolar transistors the cut-off frequency $f_T$, which is a guide to high speed operational properties, increases as the base region becomes thinner. Furthermore, as the size of the transistor becomes reduced, the parasitic capacitance is reduced and operational speed becomes faster. Ion implantation is used as a method of forming thin base regions, but there is a limit to how thinly impurity ions can be implanted. Furthermore, with the ion implantation method, it is necessary to eliminate displacement of silicon atoms of the lattice, in other words lattice defect of the single crystal silicon, resulting from the implanted ions. For this purpose, the annealing process is performed by heating to a high temperature. However, in the annealing process, the implanted impurities are diffused. As a result, the thickness of the base region inevitably increases by this amount.

A low temperature epitaxial growth method is known as a technique for forming thin base regions. A bipolar transistor and a method of its production, employing this method, is described in Japanese Patent Application Laid-Open Publication No. H4-330730.

With reference to FIG. 1 which is a cross-section of the semiconductor device, the structure of the bipolar transistor described in the above-mentioned publication is as follows.

An $N^+$-type buried layer 202 in which the impurity is arsenic is selectively formed on the surface of a $P^-$-type single crystal silicon substrate 201 having a resistivity of 10 to 15 Ωcm. The surface of the $P^-$-type single crystal silicon substrate 201 is covered by an $N^-$-type silicon epitaxial layer 203 which has a thickness of approximately 1.0 μm and an impurity concentration of approximately $5\times10^{15}$ cm$^{-3}$. Field oxide films 204 and 204a for element isolation, which reach either the $P^-$-type single crystal silicon substrate 201 or the $N^+$-type buried layer 202, are formed by a known selective oxidation method in the $N^-$-type silicon epitaxial layer 203. The field oxide film 204 isolates the bipolar transistor. One of the $N^-$-type silicon epitaxial layers 203, which are surrounded by the field oxide film 204 and are divided off by the field oxide film 204a, is transformed into an $N^+$-type collector drawing region 205 by phosphorus diffusion. In this way the silicon substrate or body 206 is constructed.

The top surface of the silicon substrate 206 is covered by a silicon nitride film 207. An opening 214 which reaches the $N^+$-type collector drawing region 205, and an opening 243 which reaches the $N^-$-type silicon epitaxial layer 203 are provided in the silicon nitride film 207. The opening 214 is filled with an $N^+$-type polycrystalline silicon film 212 which is connected to the $N^+$-type collector drawing region 205 and constitutes a collector drawing electrode. The top surface of the silicon nitride film 207 in the vicinity of the opening 243 is covered by a base drawing electrode $P^+$-type polycrystalline silicon film 211 which has a protrusion of a width D extending in the direction inside the opening 243. The silicon nitride film 207 and the polycrystalline silicon films 211 and 212 are covered by a silicon oxide film 213. An opening 241 is provided in the silicon oxide film 213 and the above-mentioned $P^+$-type polycrystalline silicon film 211 immediately above the opening 243, and a first spacer 219 comprising a silicon oxide film is provided on the side surface of the opening 241.

The top surface of the $N^-$-type silicon epitaxial layer 203 which is exposed in the opening 243 is covered by a P-type single-crystal silicon layer 221 which is an intrinsic base region, and the lower surface of the $P^+$-type polycrystalline-silicon film 211 which is exposed in the above-mentioned protrusion is covered by a P-type polycrystalline silicon film 222. The P-type single-crystal silicon layer 221 and the P-type polycrystalline silicon film 222 are selectively formed on the surfaces of a single-crystal silicon layer and a polycrystalline silicon film by low temperature epitaxial growth. The top surface of the P-type single crystal silicon layer 221 and the lower surface of the P-type polycrystalline silicon film 222 are connected to each other. The lower surface and at least part of the side surface of the spacer 215, part of the top surface of the P-type single crystal silicon layer 221 and the side surface of the P-type polycrystalline silicon film 222 are covered by a second spacer 225 comprising a silicon oxide film. An N-type single crystal silicon layer 226 which is an emitter region which covers the top surface of the P-type single crystal silicon layer 221, is filled in a space formed in the spacer 225. Openings which respectively reach the $P^+$-type polycrystalline silicon film 211 and the $N^+$-type polycrystalline silicon film 212 are provided in the silicon oxide film 213. On the top surface of the silicon oxide film 213 are provided a metal electrode 231 which is connected to the N-type single crystal silicon layer 226, and metal electrodes 232 and 233 which are connected via openings formed through the silicon oxide film 213 to the $P^+$-type polycrystalline silicon film 211 and the $N^+$-type polycrystalline silicon film 212 respectively. The metal electrodes 231, 232 and 233 are made of aluminum or the like.

In the bipolar transistor mentioned in the above-mentioned publication, it is possible for the film thickness to be thinner than that of an intrinsic base region formed by ion implantation. However, there is the following problem.

This problem relates to parasitic capacitance. Insulating isolation between the $P^+$-type polycrystalline silicon film 211 which constitutes the base drawing electrode and the $N^-$-type silicon epitaxial layer 203 which constitutes part of the collector region is performed by a silicon nitride film 207. In order that the $P^+$-type polycrystalline silicon film 211 and the P-type single crystal silicon layer 221 which is the intrinsic base region are satisfactorily connected, it is not preferable that the film thickness of the silicon nitride film 207 be greater than the sum of the film thickness of the P-type single crystal silicon layer 221, which is selectively grown epitaxially, and the film thickness of the P-type polycrystalline silicon film 222 which is selectively grown at the same time. If the film thickness of the P-type single crystal silicon layer 221, which is the intrinsic base region, is reduced in order to improve the cut-off frequency $f_T$, naturally the thickness of the silicon nitride film 207 must be reduced. In this case, the parasitic capacitance formed between the base region and the collector region increases, and the transistor performance is lowered.

SUMMARY OF THE INVENTION

An object of the present invention is to provide a semiconductor device having a reduced parasitic capacitance between the base region and the collector region while maintaining the cut-off frequency $f_T$ higher.

According to the present invention, there is provided a semiconductor device, comprising:

- a single crystal silicon substrate of one conduction type, which has selectively on its surface a buried layer of reverse conduction type, at least part of the top surface of which is covered by a silicon epitaxial layer of reverse conduction type;
- a first silicon oxide film which is provided on the surface of said single crystal silicon substrate and which has a first opening which reaches the silicon epitaxial layer;
- a silicon nitride film which is provided on the surface of the first silicon oxide film, and which has a second opening which is connected to the first opening and is of a form enclosing the first opening;
- a second silicon oxide film which is provided on the silicon nitride film, and which has a third opening which is connected to the second opening and has substantially the same shape as the first opening;
- a base drawing electrode which is provided on the surface of the second silicon oxide film at least in the vicinity of the third opening, which base drawing electrode has a protrusion of a prescribed width extending from the end of the third opening and has a fourth opening of a form such that it is enclosed by the third opening, at least the bottom layer of the base drawing electrode comprising a first polycrystalline semiconductor film of one conduction type;
- a third silicon oxide film which directly covers the base drawing electrode and which has the fourth opening;
- a first spacer comprising a fourth silicon oxide film which directly covers the side surface of the third silicon oxide film and the side surface of the base drawing electrode, which constitute the side wall of the fourth opening;
- a second polycrystalline semiconductor film of one conduction type, which is provided inside the second opening with a prescribed width, which second polycrystalline semiconductor film directly covers the lower surface of the second silicon oxide film and the top surface of the first silicon oxide film which are exposed by the second opening, and which second polycrystalline semiconductor film directly covers the side surface of the silicon nitride film constituting the side wall of the second opening;
- a third polycrystalline semiconductor film of one conduction type, which is connected directly to the lower surface of the first polycrystalline semiconductor film which is exposed by the third opening, which third polycrystalline semiconductor film directly covers the side surface of the second silicon oxide film constituting the side wall of the third opening, and which is directly connected to the top surface of the second polycrystalline semiconductor film which is exposed by the third opening, and part of the side surface of the second polycrystalline semiconductor film which is exposed inside the second opening;
- a first single crystal semiconductor layer of one conduction type, which is directly connected to the top surface of the silicon epitaxial layer which is exposed by the first opening, which first single crystal semiconductor layer is directly connected to at least the lower surface of the third polycrystalline semiconductor film and to the second polycrystalline semiconductor film, and which fills at least part of the first opening;
- a second spacer comprising a fifth silicon oxide film which directly covers at least part of the side surface of the first spacer, the lower surface of the first spacer which is exposed by the third opening, and the side surface of the third polycrystalline semiconductor film which is exposed at least inside the second opening and the third opening, and which second spacer directly covers part of the top surface of the first single crystal semiconductor layer which is exposed inside the second opening; and
- a second single crystal semiconductor layer of reverse conduction type which directly covers at least part of the side surface of the second spacer and which is directly connected to the top surface of the first single crystal semiconductor layer which is not covered by the second spacer.

According to the present invention, there is also provided a semiconductor device, comprising:

- a single crystal silicon substrate of one conduction type, which has selectively on its surface a buried layer of reverse conduction type, at least part of the top surface of which is covered by a silicon epitaxial layer of reverse conduction type;
- a first silicon oxide film which is provided on the surface of the single crystal silicon substrate and which has at its bottom a first opening which reaches the silicon epitaxial layer and has at its top a second opening which is connected to the first opening and has a form enclosing said first opening;
- a silicon nitride film which is provided on the surface of the first silicon oxide film and which has a third opening which is connected to the second opening and has a form such that it is enclosed by the second opening;
- a second silicon oxide film which is provided on the surface of the silicon nitride film and which has a fourth opening which is connected to the third opening and has substantially the same shape as the second opening;
- a base drawing electrode which is provided on the surface of the second silicon oxide film at least in the vicinity of the fourth opening, which base drawing electrode has a protrusion of a prescribed width extending from the end of the fourth opening and has a fifth opening of a form such that it is enclosed by the third opening, at least the bottom layer of the base drawing electrode comprising a first polycrystalline semiconductor film of one conduction type;
- a third silicon oxide film which directly covers the base drawing electrode and which has the fifth opening;
- a first spacer comprising a fourth silicon oxide film which directly covers the side surface of the third silicon oxide film and the side surface of the base drawing electrode, which constitute the side wall of the fifth opening;
- a second polycrystalline semiconductor film of one conduction type, which is provided inside the second, the third and the fourth openings immediately below the lower surface of the first polycrystalline semiconductor film which is exposed by the fourth opening, and which second polycrystalline semiconductor film directly covers the top surface and the side surface of the first silicon oxide film which is exposed by the second opening, and the lower surface of the silicon nitride film, and the side surface of the silicon nitride film constituting the side wall of the third opening, and the top surface of the silicon nitride film which is exposed by the fourth opening, and the side surface of the second silicon oxide film constituting the side wall of said fourth opening, and which second polycrystalline semiconductor film is directly connected to the lower surface of the first polycrystalline semiconductor film which is exposed by the fourth opening;

a third polycrystalline semiconductor film of one conduction type, which directly covers part of the side surface of the first silicon oxide film constituting the side wall of the first opening and at least part of the lower surface of the first spacer, and which third polycrystalline semiconductor film is directly connected to the side surface of the second polycrystalline semiconductor film and the lower surface of the second polycrystalline semiconductor film which is exposed by the first opening;

a first single crystal semiconductor layer of one conduction type, which is directly connected to the lower surface of the third polycrystalline semiconductor film and the top surface of the silicon epitaxial layer which is exposed by said first opening, and which first single crystal semiconductor layer fills part of the first opening;

a second spacer comprising a fifth silicon oxide film which directly covers at least part of the side surface of the first spacer, the lower surface of the first spacer which is exposed by the fourth opening and is not covered by the third polycrystalline semiconductor film, the side surface of the third polycrystalline semiconductor film, and part of the top surface of the first single crystal semiconductor layer which is exposed inside the first opening; and a second single crystal semiconductor layer of reverse conduction type which directly covers at least part of the side surface of the second spacer and which is directly connected to the top surface of the first single crystal semiconductor layer which is exposed inside the first opening and is not covered by the second spacer.

In the present invention, preferably the first single crystal semiconductor layer and the third polycrystalline semiconductor film are made of silicon-germanium. Also, preferably the base drawing electrode comprises the first polycrystalline semiconductor film and a high melting point metal silicide film which is directly connected to the top surface of the first polycrystalline semiconductor film.

According to the semiconductor device of the present invention, it is possible to increase the film thickness of a laminated insulation film which insulates and separates a first polycrystalline silicon film of one conduction type which constitutes at least part of the base drawing electrode and silicon epitaxial layer of reverse conduction type which forms part of the collector region. Furthermore, by providing a second polycrystalline semiconductor film of one conduction type, which directly covers part of the side wall of an opening which is provided in the laminated insulation film and which reaches the above-mentioned silicon epitaxial layer, it is simple to make thin the first single crystal semiconductor layer of one conduction type which constitutes the intrinsic base region. It is thus possible to reduce the parasitic capacity between the base region and the collector region without sacrificing improvements in the cut-off frequency $f_T$.

DESCRIPTION OF THE PREFERRED EMBODIMENTS

The present invention will now be described with reference to the accompanying drawings.

Figure 1:
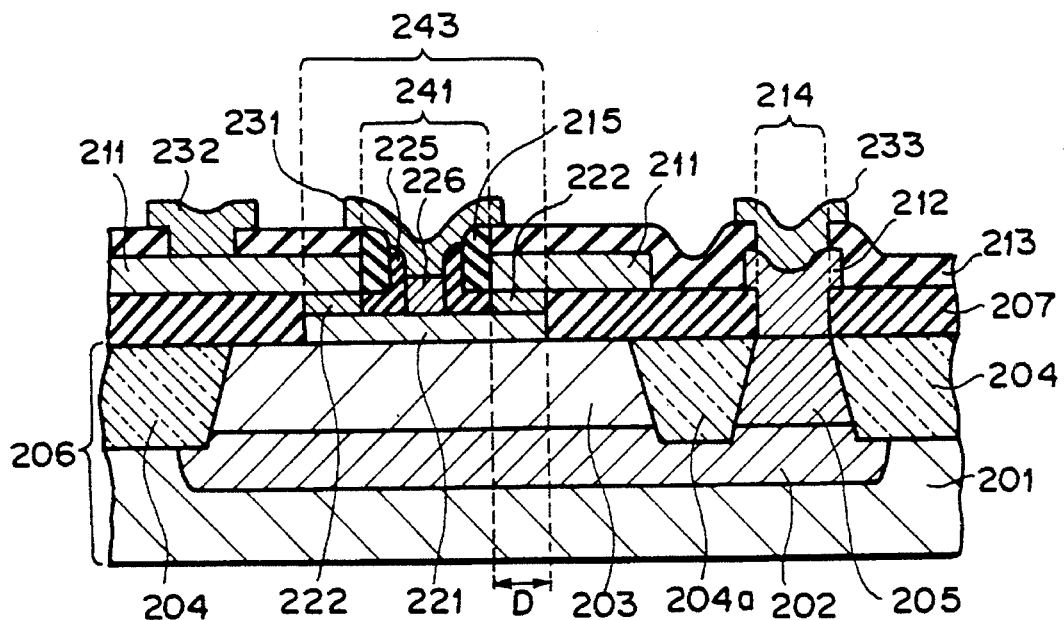
FIG. 1 is a cross-section of a conventional semiconductor device.
Figure 2:
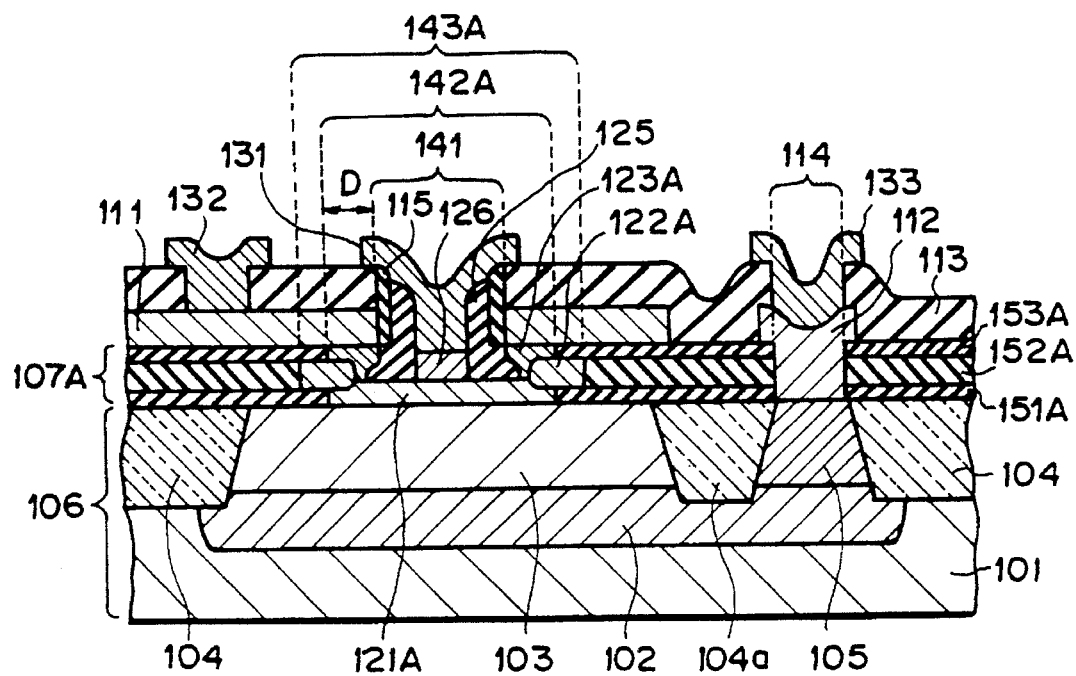
FIG. 2 is a cross-section of a first embodiment of the present invention.

Referring to FIG. 2 which is a cross-section of a semiconductor device, a first embodiment of the present invention is constructed as follows, An $N^+$-type buried layer 102 having a thickness of about 2 μm which has the impurity is arsenic or antimony is selectively formed on the surface of a (100)-oriented $P^-$-type single crystal silicon substrate 101 which has a resistivity at room temperature of 10 to 20 Ωcm. The surface of the $P^-$-type single crystal silicon substrate 101 is covered by an $N^-$-type silicon epitaxial layer 103 constituting part of a collector region including phosphorus at a concentration of approximately $1 \times 10^{16}$ cm$^{-1}$. The $N^-$-type silicon epitaxial layer 103 has a region of approximately constant impurity concentration having a thickness of about 0.4 μm and a transition region to the $N^+$-type buried layer 102 having a thickness of about 0.6 μm. Field oxide films 104 and 104a for element isolation which reach either the $P^-$-type single crystal silicon substrate 101 or the $N^+$-type buried layer 102 are formed in the above-mentioned $N^-$-type silicon epitaxial layer 103 by a known selective oxidation method. The field oxide film 104 isolates each bipolar transistor. One of the $N^-$-type silicon epitaxial layers 103 which are surrounded by the field oxide film 104 and are divided off by the field oxide film 104a is transformed into an $N^+$-type collector drawing region 105 with an impurity concentration of about $1 \times 10^{19}$ cm$^{-3}$ formed by the diffusion of phosphorus, and thus the collector resistance is reduced. A silicon substrate or body 106 is constituted by the $P^-$-type single crystal silicon substrate 101, the $N^+$-type buried layer 102, the $N^-$-type silicon epitaxial layer 103, the field oxide films 104 and 104a and the $N^+$-type collector drawing region 105.

The top surface of the silicon substrate 106 is covered by a laminated insulation film 107A which has a film thickness of about 200 nm. The laminated insulation film 107A comprises a first silicon oxide film 151A which has a film thickness of about 50 nm, a silicon nitride film 152A which has a film thickness of about 100 nm and a second silicon oxide film 153A which has a film thickness of about 50 nm. An opening 114 which reaches the $N^+$-type collector drawing region 105 is provided in the laminated insulation film 107A. The opening 114 is filled with an N⁺-type polycrystalline silicon film 112 serving as a collector drawing electrode which is connected to the N⁺-type collector drawing region 105.

Openings 142A which are a first opening and a third opening which reach the above-mentioned N⁻-type silicon epitaxial layer 103 are provided in the silicon oxide film 151A and the silicon oxide film 153A. An opening 143A which is a second opening is provided in the silicon nitride film 152A. The opening 143A is connected to the openings 142A above and below, and has a form enclosing the openings 142A.

The top surface of the silicon oxide film 153A in the vicinity of the opening 142A is covered by a P⁺-type polycrystalline silicon film 111 which is a first polycrystalline semiconductor film, used as a base drawing electrode. The P⁺-type polycrystalline silicon film 111 has an opening 141 which is a fourth opening positioned with a prescribed width D inside the above-mentioned opening 142A. The silicon oxide film 153A and the polycrystalline silicon films 111 and 112 are covered by a third silicon oxide film 113. The opening 141 is also provided in the silicon oxide film 113. A first spacer comprising a fourth silicon oxide film 115 is provided on the side wall of the opening 141.

A P⁺-type polycrystalline silicon film 122A of a prescribed width, which is a second polycrystalline semiconductor film, is provided in the opening 143A which is sandwiched between the above-mentioned two openings 142A. The P⁺-type polycrystalline silicon film 122A directly covers the side surface of the silicon nitride film 152A constituting the side wall of the opening 143A, and the top surface of the silicon oxide film 151A and the lower surface of the silicon oxide film 153A which are each exposed by the openings 142A. The inside end of the P⁺-type polycrystalline silicon film 122A is preferably outside the opening 141. A P⁺-type polycrystalline silicon film 123A which is a third polycrystalline semiconductor film is provided in at least part of the opening 143A and the opening 142A provided in the silicon oxide film 153A. The P⁺-type polycrystalline silicon film 123A directly covers the side surface of the silicon oxide film 153A constituting the side wall of the upper opening 142A, it is directly connected to the lower surface of the P⁺-type polycrystalline silicon film 111 of width D which is exposed by the opening 142A, and is directly connected to the lower surface of the P⁺-type polycrystalline silicon film 122A which is exposed by the upper opening 142A and to part of the side surface of the P⁺-type polycrystalline silicon film 122A which is exposed within the opening 143A. A P-type single crystal silicon layer 121A with an impurity concentration of about $1\times10^{18}$ cm$^{-3}$ constituting an intrinsic base region, which is a first single crystal semiconductor layer, is provided in the opening 142A which is provided in the silicon oxide film 151A, and in at least part of the opening 143A. The P-type single crystal silicon layer 121A directly covers the side surface of the silicon oxide film 151A constituting the side wall of the lower opening 142A, and is directly connected to the lower surface of the P⁺-type polycrystalline silicon film 122A and the top surface of the N⁻-type silicon epitaxial layer 103, which are exposed by the opening 142A, and the lower surface of the P⁺-type polycrystalline silicon film 123A which is exposed in the opening 143A.

The P⁺-type polycrystalline silicon films 122A and 123A each constitute part of the base region. In the present embodiment, the P-type single crystal silicon layer 121A has a form such that it fills the lower opening 142A and part of the opening 143A. However, the present invention is not limited to this, and the whole of the exposed surface of the above-mentioned P⁺-type polycrystalline silicon film 122A may be covered by the P⁺-type polycrystalline silicon film 123A. In this case, the connection between the P-type single crystal silicon layer 121A and the P⁺-type polycrystalline silicon film 122A is not effected directly, but is effected via the P⁺-type polycrystalline silicon film 123A. In this case, the P-type single crystal silicon layer 121A fills part of the lower opening 142A without filling the opening 143A.

The lower surface and part of the side surface of the first spacer comprising the silicon oxide film 115, and the side surface of the P⁺-type polycrystalline silicon film 123A, and part of the top surface of the P-type single crystal silicon layer 121A are covered by a second spacer comprising a fifth silicon oxide film 125. And the N⁺-type single crystal silicon layer 126 which is a second single crystal semiconductor layer and is an emitter region is provided in a gap formed in the second spacer as directly connected to the top surface of the P-type single crystal silicon layer 121A. Openings which reach respectively the P⁺-type polycrystalline silicon film 111 and the N⁺-type polycrystalline silicon film 112 are provided in the above-mentioned silicon oxide film 113. A metal electrode 131 which is connected to the N⁺-type single-crystal silicon layer. 126, and metal electrodes 132 and 133 which are connected respectively via the openings to the P⁺-type polycrystalline silicon film 111 and the N⁺-type polycrystalline silicon film 112 are provided on the top surface of the silicon oxide film 113. The metal electrodes 131, 132 and 133 are made of an aluminum alloy film, for example an aluminum-silicon alloy film.

According to the above-mentioned first embodiment, a P⁺-type polycrystalline silicon film 122A of a desired width is provided on the side wall of the opening 143A which is provided in the silicon nitride film 152A constituting the middle layer of the laminated insulation film 107A. It is thus possible to increase the film thickness of the laminated insulation film 107A (including the silicon nitride film 152A), and to reduce the film thickness of the P-type single crystal silicon film 121A which is the intrinsic base region. As a result, it is possible to reduce the parasitic capacity between the collector region and the base region, whilst at the same time improving the cut-off frequency $f_T$. Thus, by adopting the present embodiment, it is possible to realize the high speed bipolar transistor simply.

It should be noted that the emitter region in the above-mentioned first embodiment comprises an N⁺-type single crystal silicon layer 126, but it may also be an N⁺-type diffusion layer (in this case, the N⁺-type diffusion layer is the second single-crystal semiconductor layer) provided on the surface of the P-type single crystal silicon layer 121A which is exposed in the gap of the spacer comprising the fifth silicon oxide film 125. In this case, N⁺-type polycrystalline silicon film (a fourth polycrystalline semiconductor film which is an emitter drawing electrode), which has a form such that it fills the gap in the spacer comprising the fifth silicon oxide film 125, is provided covering the top surface of the N⁺-type diffusion layer.

With reference to FIGS. 3A to 3C and FIGS. 4A and 4B, which are cross-sections in the manufacturing process of the semiconductor device, the bipolar transistor of the above-mentioned first embodiment is formed as follows.

Firstly, an N⁺-type buried layer 102 of a thickness of about 2 μm, with arsenic or antimony as the impurity, is selectively formed using a known technique on the surface of a (100)-oriented P⁻-type single crystal silicon substrate 101 which has a resistivity at room temperature of 10 to 20 Ωcm. Next, an N⁻-type silicon epitaxial layer 103, constituting part of the collector region, including phosphorus at a concentration of approximately $1\times10^{16}$ cm$^{-3}$ (comprising a region of approximately constant impurity concentration having a thickness of about 0.4 μm and a transition region to the N⁺-type buried layer 102 having a thickness of about 0.6 μm) is formed over the whole surface. A prescribed region of the N⁺-type silicon epitaxial layer 103 is heat oxidized using a known selective oxidation method to form element isolation field oxide films 104 and 104a which reach either the P⁻-type single crystal silicon substrate 101 or the N⁺-type buried layer 102.

Next, a laminated insulation film 107A with a film thickness of about 200 nm is formed over the whole surface by successively depositing a first silicon oxide film 151A with a thickness of about 50 nm using the high temperature chemical vapor deposition (HTO) method, a silicon nitride film 152A with a film thickness of about 100 nm by the low pressure chemical vapor deposition (LPCVD) method or the plasma CVD method, and a second silicon oxide film 153A with a film thickness of about 50 nm by the HTO method. Next, an opening 114 which reaches one of the N⁻-type silicon epitaxial layers 103 which are surrounded by the field oxide film 104 and are divided off by the field oxide film 104a, is formed in the laminated insulation film 107A. A polycrystalline silicon film of a prescribed film thickness is then deposited over the whole surface. The polycrystalline silicon film is transformed into an N⁺-type polycrystalline silicon film by phosphorus diffusion, and after removing the PSG film formed by the phosphorus diffusion, the N⁺-type polycrystalline silicon film is patterned to form an N⁺-type polycrystalline silicon film 112 which is a collector drawing electrode covering the above-mentioned opening 114. Next, phosphorus is implanted by heat oxidation, and the N⁻-type silicon epitaxial layer 103 immediately below the above-mentioned opening 114 becomes an N⁺-type collector drawing region 105 with an impurity concentration of about $1\times10^{19}$ cm$^{-3}$, and at the same time a silicon oxide film (not shown) with a prescribed film thickness is formed on the exposed surface of the N⁺-type polycrystalline silicon film 112. Further, a silicon substrate 106 comprising the P⁻-type single crystal silicon substrate 101, the N⁺-type buried layer 102, the N⁻-type silicon epitaxial layer 103, the field oxide films 104 and 104a, and the N⁺-type collector drawing region 105, is formed.

Figure 3A:
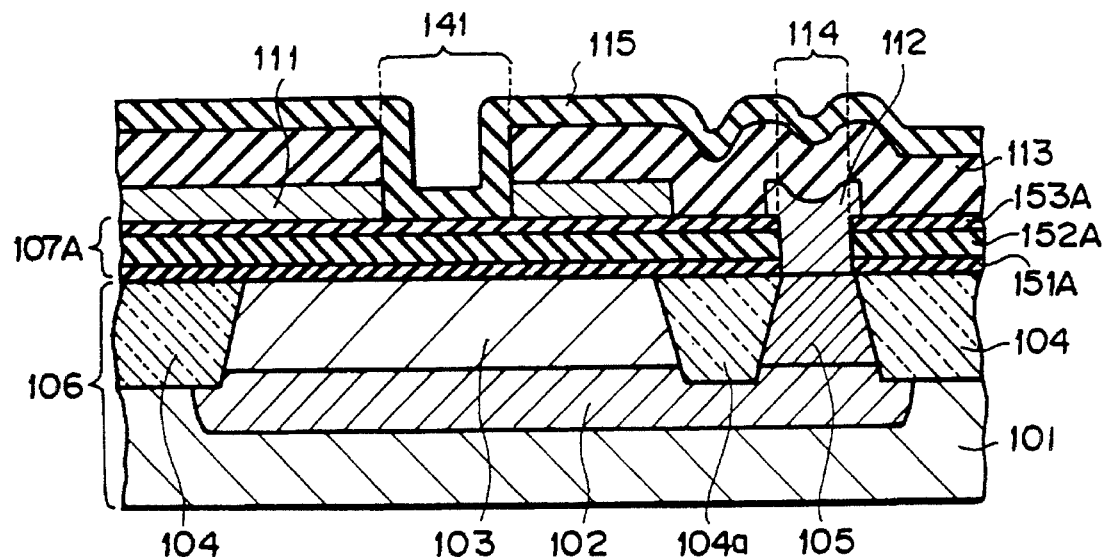
FIGS. 3A to 3C are cross-sections in the production processes of the above-mentioned first embodiment, respectively.

A polycrystalline silicon film of a prescribed thickness is then once again deposited over the whole surface. Boron is diffused into this polycrystalline silicon film, transforming it into a P⁺-type polycrystalline silicon film. After removing the BSG film which is formed by the diffusion, the P⁺-type polycrystalline silicon film is patterned, and a P⁺-type polycrystalline silicon film 111 constituting a base drawing electrode, which is a first polycrystal semiconductor film covering at least the top of part of the N⁻-type silicon epitaxial layer 103, is formed. A third silicon oxide film 113 which has a film thickness of about 350 nm is then deposited over the whole surface. The silicon oxide film 113 and the P⁺-type polycrystalline silicon film 111 in a prescribed region with a form enclosing the region corresponding to the emitter region are removed by successive anisotropic etching, thereby forming an opening 141. A fourth silicon oxide film 115 with a thickness of about 250 nm is deposited over the whole surface (FIG. 3A).

Figure 3B:
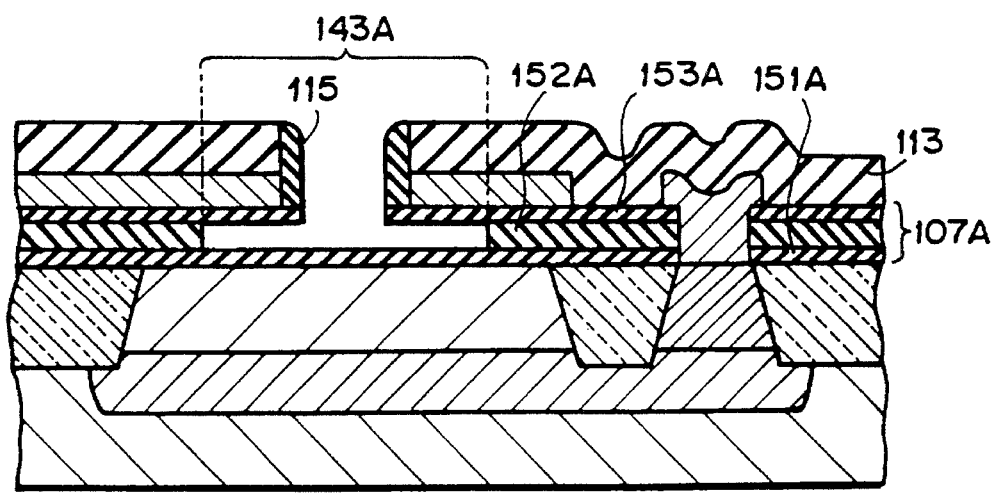

Etching back is then performed by anisotropic etching of the silicon oxide film 115. In this way a first spacer comprising a fourth silicon oxide film 115 is formed on the side wall of the opening 141, covering the side surface of the silicon oxide film 113 and the P⁺-type polycrystalline silicon film 111. The silicon oxide film 153A directly below the above-mentioned first spacer is also removed by this etching back. At this stage, the film thickness of the silicon oxide film 113 is about 300 nm, and the width of the first spacer comprising the silicon oxide film 115 is about 200 nm. The silicon nitride film 152A is then etched by hot phosphoric acid, thereby forming an opening 143A. The opening 143A is about 180 nm wider than the opening 141. In other words, about 180 nm of the silicon nitride film 152A directly below the P⁺-type polycrystalline silicon film 111 is undercut by about 430 nm from the end of the first spacer comprising the silicon oxide film 115 (FIG. 3B).

Figure 3C:
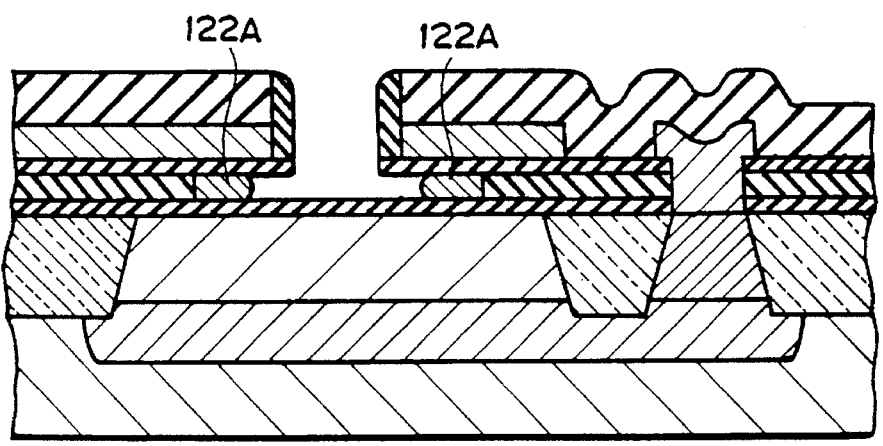

Silicon which is doped with a high concentration of boron is then selectively grown in a deposition apparatus by means of a low temperature CVD method known as the Cold-Wall Type UHV (ultra high vacuum)/CVD method. In this way, a P⁺-type polycrystalline silicon layer 122A which has a width of about 60 nm and a boron concentration of about $7\times10^{19}$ cm$^{-3}$, which is a second polycrystalline silicon film, is formed on the side surface of the silicon nitride film 152A which are exposed in the opening 143A (FIG. 3C). The conditions of deposition are at a pressure of about $2.7\times10^{-3}$ Pa and a substrate temperature of about 560° C. Diboran ($B_2H_6$) is used as the doping gas, and disilane ($Si_2H_6$) at a flow of 70 sccm is used as the raw material gas. Growth time is about 10 minutes. The reason for this condition is that selective growth to the silicon nitride film occurs during the initial stage, and this selectivity is maintained for about 13 minutes from the start of growth.

Figure 4A:
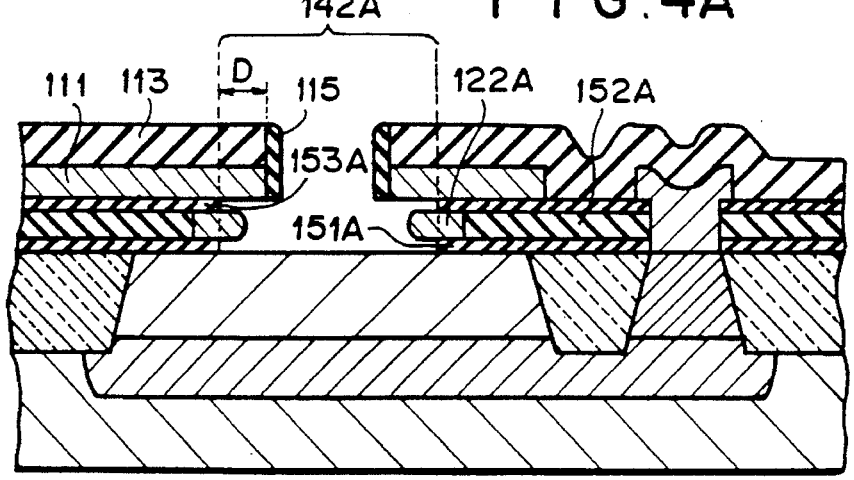
FIGS. 4A and 4B are cross-sections in the production processes of the above-mentioned first embodiment, respectively.

Isotropic etching of the silicon oxide film is then performed using buffered fluoricacid in a ratio of fluoric acid to ammonium fluoride of about 1:30, and the silicon oxide film 151A and the silicon oxide film 153A immediately below the P⁺-type polycrystalline silicon film 111 are undercut by about 150 nm (about 350 nm from the end of the first spacer comprising the silicon oxide film 115), thereby forming an opening 142A, and exposing the top surface of the N⁻-type silicon epitaxial layer 103. At this time, the film thickness of the silicon oxide film 113 is about 250 nm, and the width of the first spacer comprising the silicon oxide film 115 is about 150 nm (FIG. 4A). It should be noted that in the present embodiment, isotropic etching is suitable for forming the opening 142A, and thus contamination of the surface of the N⁻-type silicon epitaxial layer (changes in the impurity concentration etc.) is avoided.

Figure 4B:
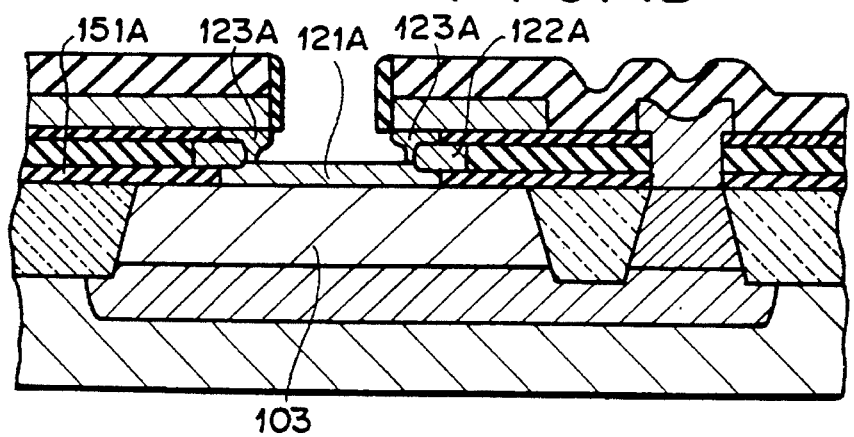

Selective growth of silicon which is doped with a low concentration of boron is then performed once again in the deposition apparatus by means of the UHV/CVD method. Except that the flow of diboran is reduced, the growth conditions are the same as the conditions mentioned above. Thus a P-type single crystal silicon layer 121A which has a film thickness of about 60 nm and a boron concentration of about $1\times10^{18}$ cm$^{-3}$, which is a first single crystal semiconductor film, is formed on the top surface of the N⁻-type silicon epitaxial layer 103 which is exposed in the opening 142A. Simultaneously, a P-type polycrystalline silicon film (not shown) is formed covering the lower surface of the P⁺-type polycrystalline silicon film 111 and the exposed surface of the P⁺-type polycrystalline silicon layer 122A. The P-type polycrystalline silicon film and the P-type single crystal silicon layer 121A are directly connected to each other. The film thickness and impurity concentration of the P-type polycrystalline silicon film are the same as the film thickness and impurity concentration of the P-type single crystal silicon layer 121A. Heat processing is furthermore performed in the deposition apparatus at 900° C. for 5 minutes, for example. Thus, boron is diffused from the $P^+$-type polycrystalline silicon films 111 and 122A to the P-type polycrystalline silicon film and thus the P-type polycrystalline silicon film is transformed into a $P^+$-type polycrystalline silicon film 123A which has a boron concentration of approximately $1\times10^{19}$ cm$^{-3}$, which is a third polycrystalline semiconductor film (FIG. 4B).

A fifth silicon oxide film 125 is then deposited over the whole surface, and anisotropic etching is performed by RIE. Thus a second spacer comprising the silicon oxide film 125 is formed. The second spacer directly covers the lower surface and part of the side surface of the first spacer (comprising the silicon oxide film 115), the side surface of the $P^+$-type polycrystalline silicon film 123A and part of the top surface of the P-type single crystal silicon layer 121A. An $N^+$-type single crystal silicon layer 126 which is directly connected to the top surface of the P-type single crystal silicon layer 121A and which fills the space in the second spacer is formed by selective growth of the semiconductor film. The $N^+$-type single crystal silicon layer 126 is the emitter region, and is a second single crystal semiconductor layer. Openings which reach respectively the $P^+$-type polycrystalline silicon film 111 and the $N^+$-type polycrystalline silicon film 112 are formed in the above-mentioned silicon oxide film 113. An aluminum alloy film (for example an aluminum-silicon alloy film) is formed over the whole surface. The aluminum alloy film is patterned, thereby forming a metal electrode 131 which is connected to the $N^+$-type single crystal silicon layer 126, and metal electrodes 132 and 133 which are respectively connected via the above-mentioned openings to the $P^+$-type polycrystalline silicon film 111 and the $N^+$-type polycrystalline silicon film 112, and the semiconductor device of the present embodiment as shown in FIG. 2 is obtained.

Figure 5:
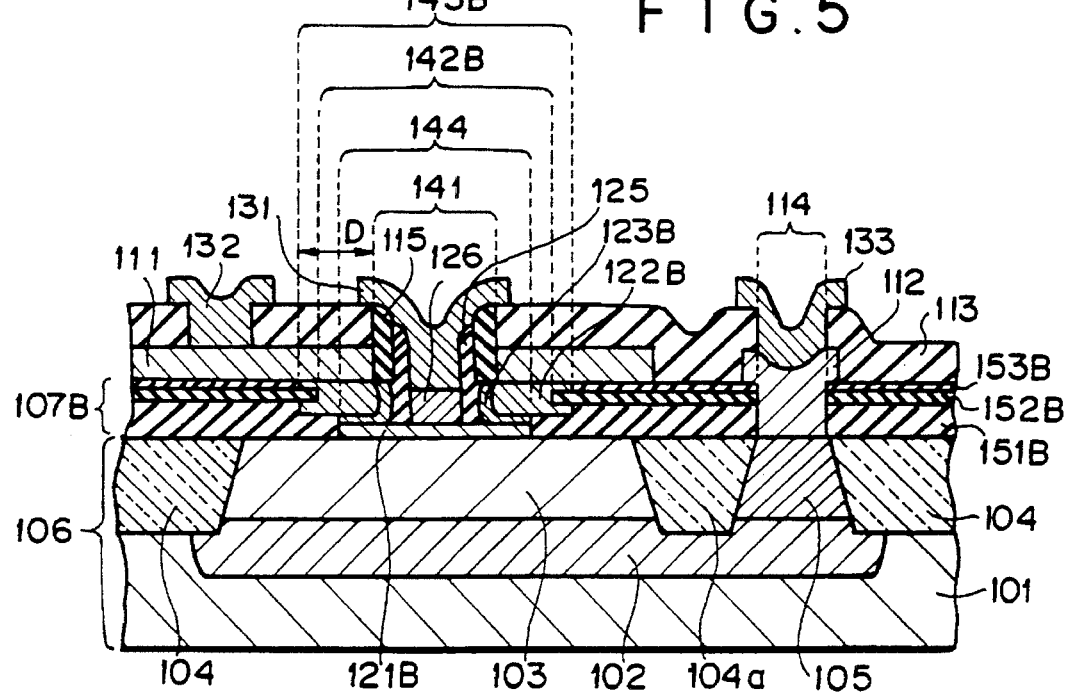
FIG. 5 is a cross-section of a second embodiment of the present invention.

With reference to FIG. 5 which is a cross-section of a semiconductor device, a second embodiment of the present invention is constructed as follows.

An $N^+$-type buried layer 102 having a thickness of about 2 μm which has the impurity is arsenic or antimony is selectively formed on the surface of a (100)-oriented $P^-$-type single crystal silicon substrate 101 which has a resistivity at room temperature of 10 to 20 Ωcm. The surface of the $P^-$-type single crystal silicon substrate 101 is covered by an $N^-$-type silicon epitaxial layer 103 constituting part of a collector region including phosphorus at a concentration of approximately $1\times10^{16}$ cm$^{-3}$. The $N^-$-type silicon epitaxial layer 103 has a region of approximately constant impurity concentration having a thickness of about 0.4 μm and a transition region to the $N^+$-type buried layer 102 having a thickness of about 0.6 μm. Field oxide films 104 and 104a for element isolation which reach either the $P^-$-type single crystal silicon substrate 101 or the $N^+$-type buried layer 102 are formed in the above-mentioned $N^-$-type silicon epitaxial layer 103 by a known selective oxidation method. The field oxide film 104 isolates each bipolar transistor. One of the $N^-$-type silicon epitaxial layers 103 which are surrounded by the field oxide film 104 and are divided off by the field oxide film 104a is transformed into an $N^+$-type collector drawing region 105 with an impurity concentration of about $1\times10^{19}$ cm$^{-3}$ formed by the diffusion of phosphorus, and thus the collector resistance is reduced. A silicon substrate or body 106 is constituted by the $P^-$-type single crystal silicon substrate 101, the $N^+$-type buried layer 102, the $N^-$-type silicon epitaxial layer 103, the field oxide films 104 and 104a and the $N^+$-type collector drawing region 105.

The top surface of the silicon substrate 106 is covered by a laminated insulation film 107B which has a film thickness of about 200 nm. The laminated insulation film 107B comprises a first silicon oxide film 151B which has a film thickness of about 100 nm, a silicon nitride film 152B which has a film thickness of about 60 nm and a second silicon oxide film 153B which has a film thickness of about 40 nm. An opening 114 which reaches the $N^+$-type collector drawing region 105 is provided in the laminated insulation film 107B. The opening 114 is filled with an $N^+$-type polycrystalline silicon film 112 serving as a collector drawing electrode which is connected to the $N^+$-type collector drawing region 105.

An opening 144 which reaches the above-mentioned $N^-$-type silicon epitaxial layer 103 is provided at the bottom of the silicon oxide film 151B. Further, a second opening 143B and a fourth opening 143B (since the second opening and the fourth opening are of the same shape they are given the same reference) are provided in the silicon oxide film 153B and the top of the silicon oxide film 151B. An opening 142B which is a third opening is provided in the silicon nitride film 152B. The opening 143B which is the second opening, provided at the top of the silicon oxide film 151B is connected to the openings 144 and 142B, and has a form such that it encloses the openings 144 and 142B. Further, the opening 143B which is the fourth opening, provided in the silicon oxide film 153B, is connected to the opening 142B and has a form such that it encloses the opening 142B.

The top surface of the silicon oxide film 153B in the vicinity of the fourth opening 143B (provided in the silicon oxide film 153B) is covered with a $P^+$-type polycrystalline silicon film 111 which is a first polycrystalline semiconductor film for use as a base drawing electrode. The $P^+$-type polycrystalline silicon film 111 has an opening 141 which is a fifth opening, positioned with a prescribed width D inside the above-mentioned opening 143B. The silicon oxide film 153B and the polycrystalline silicon film 111 and 112 are covered with a third silicon oxide film 113. This silicon oxide film 113 is also provided with an opening 141. A first spacer comprising a fourth silicon oxide film 115 is provided on the side wall of the opening 141.

A $P^+$-type polycrystalline silicon film 122B which has a prescribed width D, which is a second polycrystalline semiconductor film, is provided within the above-mentioned second opening 143B, the third opening 142B and the fourth opening 143B. The $P^+$-type polycrystalline silicon film 122B is directly connected to the lower surface of the $P^+$-type polycrystalline silicon film 111 which is exposed by the fourth opening 143B, and directly covers the side surface of the silicon oxide film 151B constituting the side wall of the second opening 143B, the side surface of the silicon nitride film 152B constituting the side wall of the third opening 142B, the side surface of the silicon oxide film 153B constituting the side wall of the fourth opening 143B, the top surface of the silicon nitride film :152B which is exposed by the fourth opening 143B, and the lower surface of the silicon nitride film 152B and the top surface of the silicon oxide film 151B which are exposed by the second opening.

A $P^+$-type polycrystalline silicon film 123B which is directly connected to the lower surface of the $P^+$-type polycrystalline silicon film 122B which is exposed by the first opening 144, and the side surface of the $P^+$-type polycrystalline silicon film 122B which is exposed by the second opening 143B, the third opening 142B and the fourth opening 143B, which is a third polycrystalline semiconductor film, is provided within (part; of) the first opening 144, the second opening 143B, the third opening 142B and the fourth opening 143B. The $P^+$-type polycrystalline silicon film 123B directly covers part of the side surface of the silicon oxide film 151B constituting the side wall of the first opening 144, and at least part of the lower surface of the first spacer comprising the fourth silicon oxide film 115. The P⁺-type polycrystalline silicon films 122B and 123B each constitute part of the base region.

A P-type single crystal silicon layer 121B with an impurity concentration of about $1\times10^{18}$ cm$^{-3}$, constituting an intrinsic base region, which is a first single crystal semiconductor layer, is provided in part of the first opening 144 which is provided in the silicon oxide film 151B. The P-type single crystal silicon layer 121B directly covers part of the side surface of the silicon oxide film 151B constituting the side wall of the first opening 144, and is directly connected to the top surface of the N⁻-type silicon epitaxial layer 103 and the lower surface of the P⁺-type polycrystalline silicon film 123B which are exposed by the opening 144.

The lower surface and part of the side surface of the first spacer comprising the silicon oxide film 115, and the side surface of the P⁺-type polycrystalline silicon film 123B, and part of the top surface of the P-type single crystal silicon layer 121B are covered by a second spacer comprising a fifth silicon oxide film 125. And the N⁺-type single crystal silicon layer 126 which is a second single crystal semiconductor layer and is an emitter region is provided in a gap formed in the second spacer as directly connected to the top surface of the P-type single crystal silicon layer 121B. Openings which reach respectively the P⁺-type polycrystalline silicon film 111 and the N⁺-type polycrystalline silicon film 112 are provided in the above-mentioned silicon oxide film 113. A metal electrode 131 which is connected to the N⁺-type single-crystal silicon layer 126, and metal electrodes 132 and 133 which are connected respectively via the openings to the P⁺-type polycrystalline silicon film 111 and the N⁺-type polycrystalline silicon film 112 are provided on the top surface of the silicon oxide film 113. The metal electrodes 131, 132 and 133 are made of an aluminum alloy film, for example an aluminum-silicon alloy film.

With reference to FIGS. 6A to 6C and FIGS. 7A to 7C, which are cross-sections in the manufacturing process of a semiconductor device, the bipolar transistor of the above-mentioned second embodiment is formed as follows.

Firstly, as in the above-mentioned first embodiment, an N⁺-type buried layer 102 is selectively formed on the surface of a P⁻-type single crystal silicon substrate 101, and an N⁻-type silicon epitaxial layer 103 formed over the whole surface. A prescribed region of an N⁻-type silicon epitaxial layer 103 is heat oxidized to form element isolation field oxide films 104 and 104a which reach either the P⁻-type single crystal silicon substrate 101 or the N⁺-type buried layer 102.

Next, a laminated insulation film 107B with a film thickness of about 200 nm is formed over the whole surface by successively depositing a first silicon oxide film 151B with a thickness of about 100 nm using the HTO method, a silicon nitride film 152B with a film thickness of about 60 nm by the LPCVD method or the plasma CVD method, and a second silicon oxide film 153B with a film thickness of about 40 nm by the HTO method. Next, an opening 114 is formed in the laminated insulation film 107B. A polycrystalline silicon film of a prescribed film thickness is then deposited over the whole surface. The polycrystalline silicon film is transformed into an N⁺-type polycrystalline silicon film by phosphorus diffusion, and after removing the PSG film formed by the phosphorus diffusion, the N⁺-type polycrystalline silicon film is patterned to form an N⁺-type polycrystalline silicon film 112 which is a collector drawing electrode covering the above-mentioned opening 114. Next, phosphorus is implanted by heat oxidation, and the N⁻-type silicon epitaxial layer 103 immediately below the above-mentioned opening 114 becomes an N⁺-type collector drawing region 105, and at the same time a silicon oxide film (not shown) with a prescribed film thickness is formed on the exposed surface of the N⁺-type polycrystalline silicon film 112. Further, a silicon substrate 106 comprising the P⁻-type single crystal silicon substrate 101, the N⁺-type buried layer 102, the N⁻-type silicon epitaxial layer 103, the field oxide films 104 and 104a, and the N⁺-type collector drawing region 105, is formed.

Figure 6A:
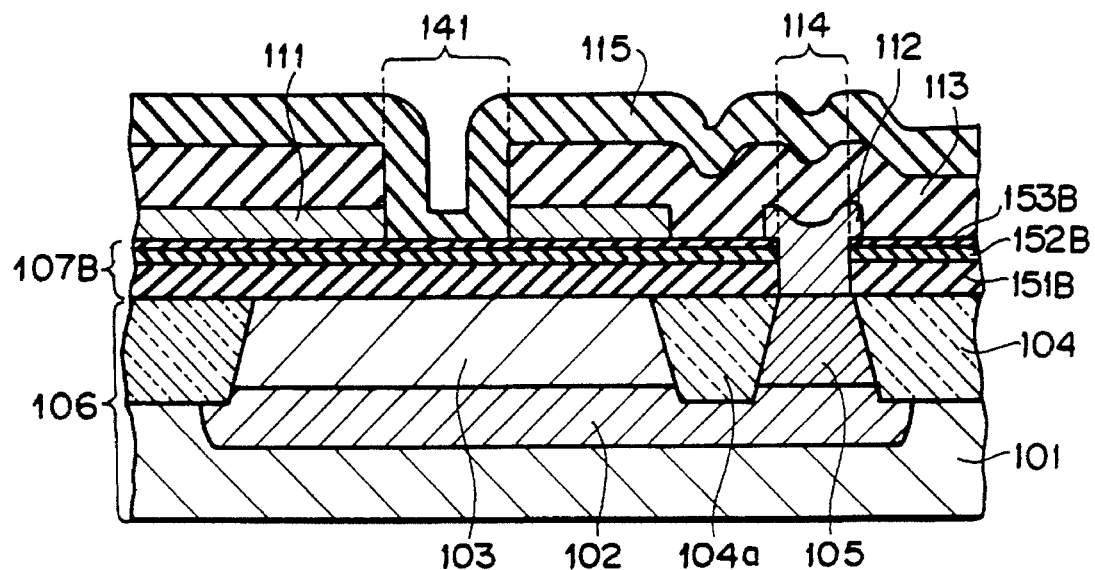
FIGS. 6A to 6C are cross-sections in the production processes of the above-mentioned second embodiment, respectively.

A polycrystalline silicon film of a prescribed thickness is then once again deposited over the whole surface. Boron is diffused into this polycrystalline silicon film, transforming it into a P⁺-type polycrystalline silicon film. The P⁺-type polycrystalline silicon film is patterned, and a P⁺-type polycrystalline silicon film 111 constituting a base drawing electrode, which is a first polycrystal semiconductor film covering at least the top of part of the N⁻-type silicon epitaxial layer 103, is formed. A third silicon oxide film 113 which has a film thickness of about 400 nm is then deposited over the whole surface. The silicon oxide film 113 and the P⁺-type polycrystalline silicon film 111 in a prescribed region with a form enclosing the region corresponding to the emitter region are removed by successive anisotropic etching, thereby forming an opening 141. A fourth silicon oxide film 115 with a thickness of about 250 nm is deposited over the whole surface (FIG. 6A).

Figure 6B:
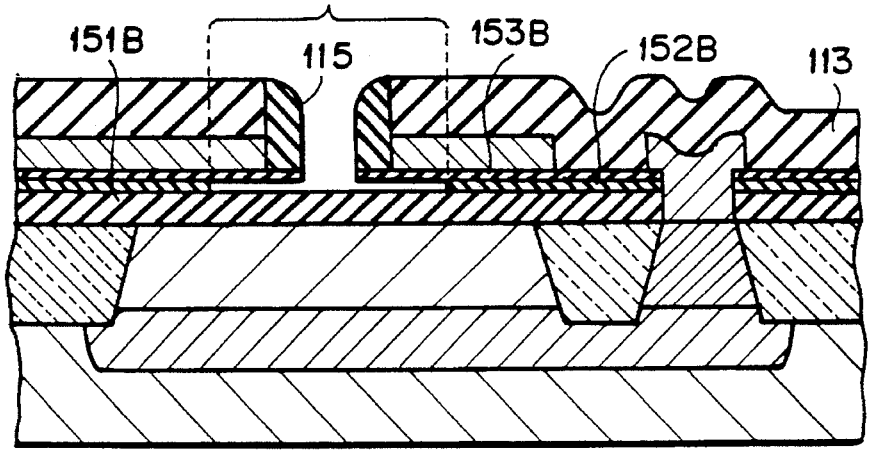

Etching back is then performed by anisotropic etching of the silicon oxide film 115. In this way a first spacer comprising a fourth silicon oxide film 115 is formed on the side wall of the opening 141, covering the side surface of the silicon oxide film 113 and the P⁺-type polycrystalline silicon film 111. The silicon oxide film 153B directly below the above-mentioned first spacer is also removed by this etching back. At this stage, the film thickness of the silicon oxide film 113 is about 350 nm, and the width of the first spacer comprising the silicon oxide film 115 is about 200 nm. The silicon nitride film 152B is then etched by hot phosphoric acid, thereby forming an opening 142B. The opening 142B is about 180 nm wider than the opening 141. In other words, about 180 nm of the silicon nitride film 152B directly below the P⁺-type polycrystalline silicon film 111 is undercut by about 430 nm from the end of the first spacer comprising the silicon oxide film 115 (FIG. 6B).

Figure 6C:
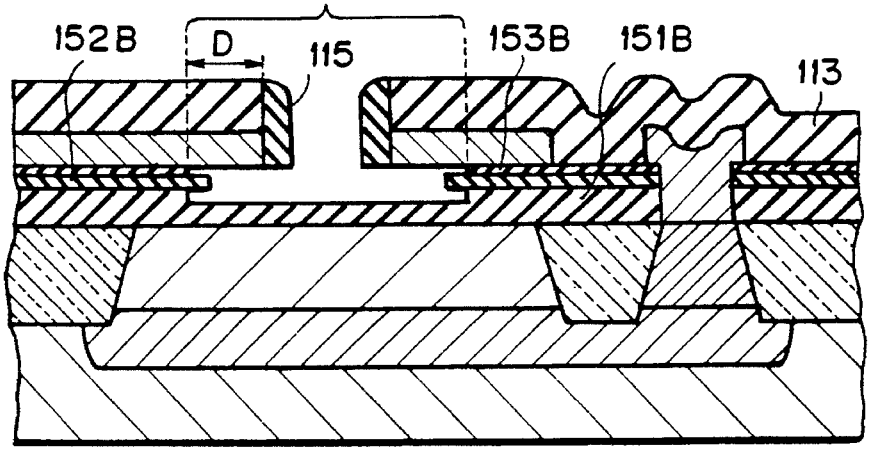

Isotropic etching of the silicon oxide film is then performed using buffered fluoric acid in a ratio of fluoric acid to ammonium fluoride of about 1:30, and the silicon oxide film 151B and the silicon oxide film 153B immediately below the P⁺-type polycrystalline silicon film ill are undercut by about 210 nm (=prescribed width D), thereby forming an opening 143B. At this time, the film thickness of the silicon oxide film 113 is about 300 nm, and the width of the first spacer comprising the silicon oxide film 115 is about 150 nm. Furthermore, the film thickness of the silicon oxide film 151B immediately below the opening 143B is about 50 nm (FIG. 6C).

Figure 7A:
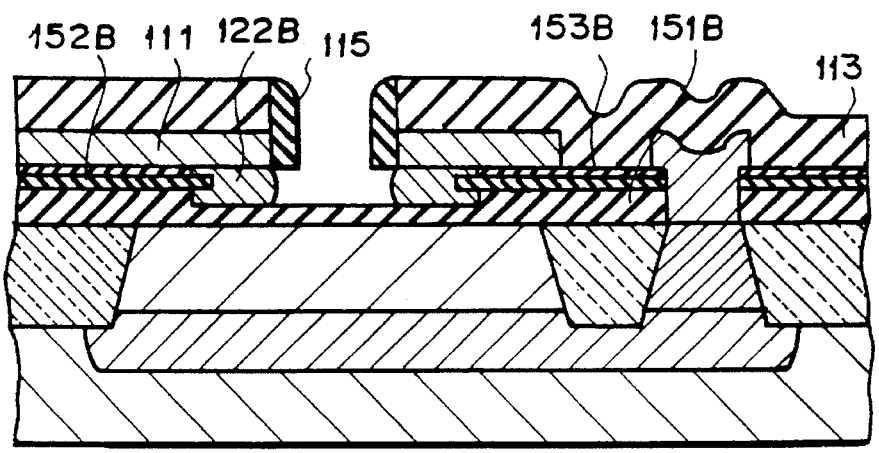
FIGS. 7A to 7C are cross-sections in the production processes of the above-mentioned second embodiment, respectively.

In the same manner as in the above-mentioned first embodiment, a P⁺-type polycrystalline silicon film 122B is then selectively grown by the UHV/CVD method (FIG. 7A).

Figure 7B:
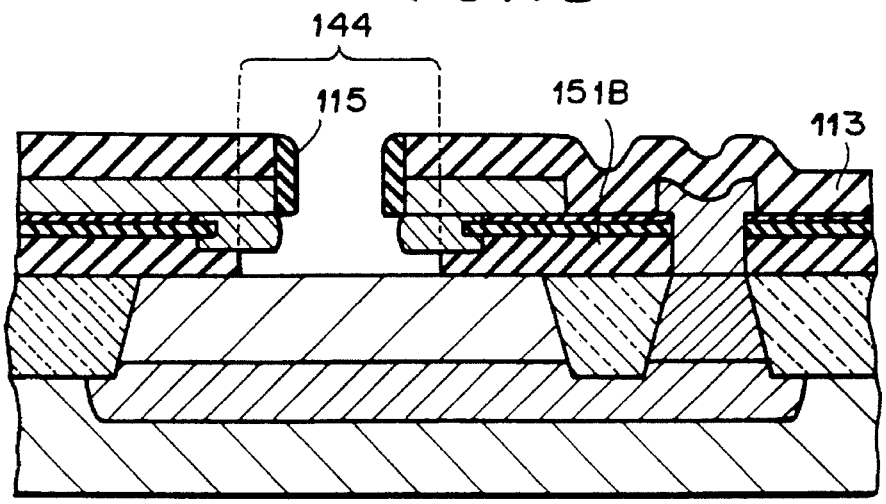

Isotropic etching of the silicon oxide film is then performed once again by using the above-mentioned buffered fluoric acid, and the silicon oxide film 151B immediately below the P⁺-type polycrystalline silicon film 111 is undercut by about 60 nm, forming an opening 144, and exposing the top surface of the N⁻-type silicon epitaxial layer 103. At this time, the film thickness of the silicon oxide film 113 is about 250 nm, and the width of the first spacer comprising the silicon oxide film 115 is about 100 nm (FIG. 7B).

Figure 7C:
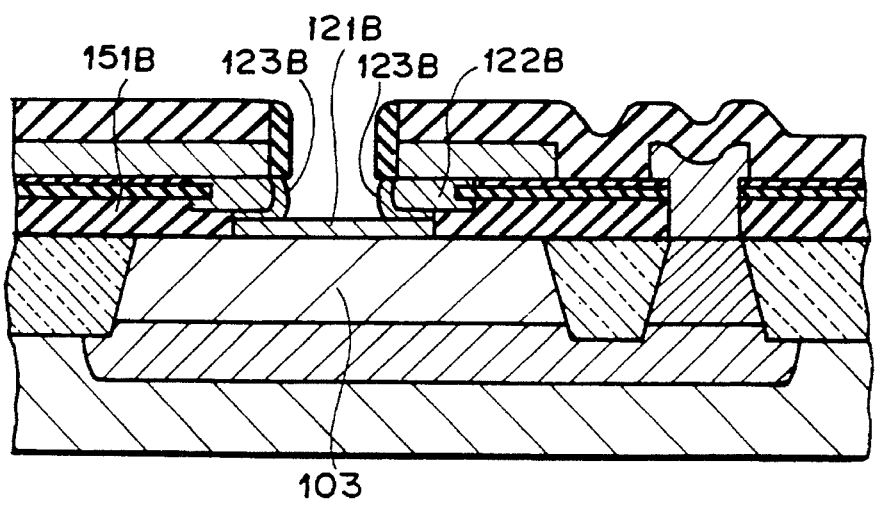

Silicon which is doped with a low concentration of boron is then selectively grown once again by the UHV/CVD method, thereby forming a P-type single crystal silicon layer 121B which has a film thickness of about 30 nm and a boron concentration of about $1 \times 10^{18}$ cm$^{-3}$ and is a first single crystal semiconductor film. At the same time, a P-type polycrystalline silicon film (not shown) which is directly connected to the exposed surface of the by the P⁺-type polycrystalline silicon layer 122B is formed. The P-type polycrystalline silicon film and the P-type single crystal silicon layer 121B are directly connected to each other. Furthermore, heat treatment is performed at 900° C. for about 5 minutes. Thus the P-type polycrystalline silicon film is transformed into a P⁺-type polycrystalline silicon film 123B which has a boron concentration of approximately $1 \times 10^{19}$ cm$^{-3}$, which is a third polycrystalline semiconductor film (FIG. 7C). Subsequent processes are exactly the same as in the above-mentioned first embodiment, and the semiconductor device shown in FIG. 5 is obtained.

The above-mentioned second embodiment has the advantages of the above-mentioned first embodiment. Furthermore, the present embodiment has the advantage that the base resistance is less than that of the above-mentioned first embodiment (which is also an advantage in relation to production). This relates to the method of forming the P⁺-type polycrystalline silicon film 122B which is the second polycrystalline semiconductor film. In the above-mentioned first embodiment, the P⁺-type polycrystalline silicon film 122A, which is the second polycrystalline semiconductor film, is formed by selective growth only on the silicon nitride film 152A. There is thus an upper limit to the width of the P⁺-type polycrystalline silicon film 122A (in the lateral direction), and therefore the value of D is restricted, and the area of contact between the P⁺-type polycrystalline silicon film 111 and the P⁺-type polycrystalline silicon film 123A, which is the third polycrystalline semiconductor film, is also restricted. In the present embodiment, in contrast, the P⁺-type polycrystalline silicon film 122B is formed by selective growth on the silicon nitride film 152B and the P⁺-type polycrystalline silicon film 111, and the restriction on the width of the P⁺-type polycrystalline silicon film 122B (in the lateral direction) is relaxed, and the area of contact between the P⁺-type polycrystalline silicon film 111 and the P⁺-type polycrystalline silicon film 122B is greatly increased. As a result, the base resistance in the present embodiment is reduced.

Figure 8:
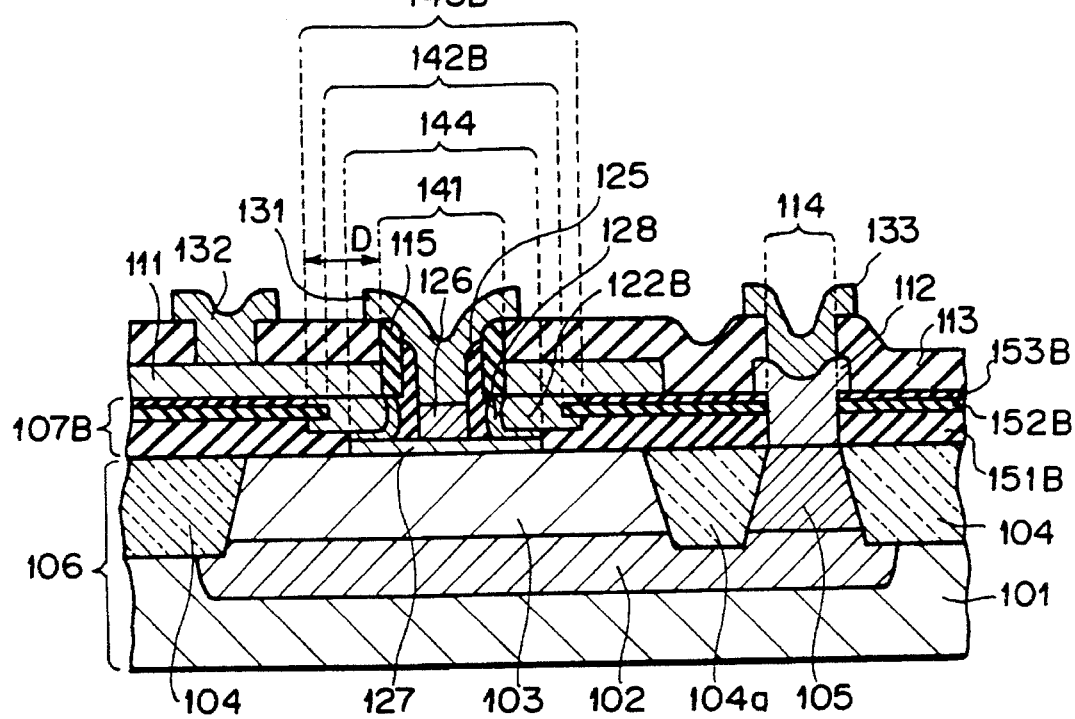
FIG. 8 is a cross-section of a third embodiment of the present invention.

With reference to FIG. 8 which is a cross-section of a semiconductor device, a third embodiment of the present invention differs from the above-mentioned second embodiment in the following points. In the present embodiment, the intrinsic base region comprises a P-type single crystal silicon-germanium alloy layer 127. Further, a third polycrystalline semiconductor film which is connected to the P-type single crystal silicon-germanium alloy layer 127 comprises a P⁺-type polycrystalline silicon-germanium alloy film 128. Thus in the present embodiment, the intrinsic base region comprises the P-type single crystal silicon-germanium alloy layer 127, and the forbidden band gap thereof is narrower than the forbidden band gap of the N⁺-type single crystal silicon layer 126 which is the emitter region. Thus the cut-off frequency $f_T$ of the bipolar transistor according to the present embodiment is improved in comparison with the above-mentioned second embodiment, and the current gain $h_{FE}$ is increased. It should be noted that the feature of the present embodiment can also be applied simply to the above-mentioned first embodiment.

Figure 9:
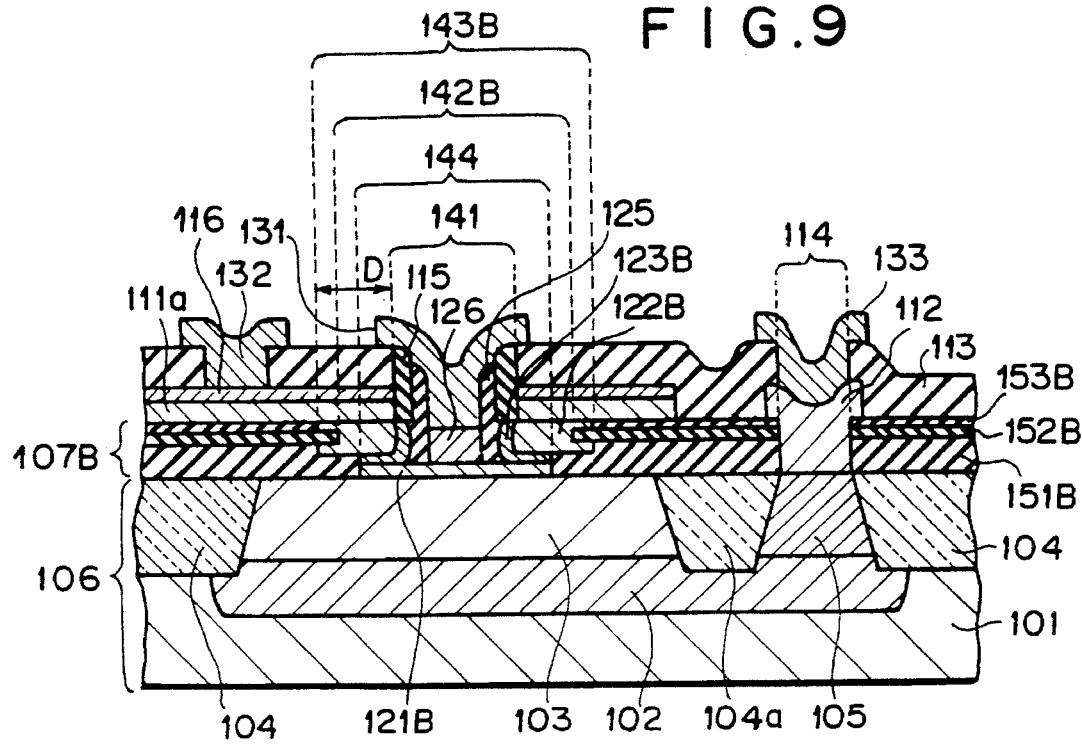
FIG. 9 is a cross-section of a fourth embodiment of the present invention.

With reference to FIG. 9 which is a cross-section of a semiconductor device, a fourth embodiment of the present invention has the following structural differences in comparison with the above-mentioned second embodiment. The base drawing electrode of the present embodiment comprises a laminated film of a P⁺-type polycrystalline silicon film 111a and a titanium silicide film 116. Thus the base resistance in the present embodiment is even lower than in the above-mentioned second embodiment. It should be noted that the feature of the above-mentioned fourth embodiment has been applied to the above-mentioned second embodiment, but it may also be applied simply to the above-mentioned first embodiment and the above-mentioned third embodiment.

The essential points in the formation of the base drawing electrode of the present embodiment are as follows. After the N⁺-type polycrystalline silicon film 112 and the N⁺-type collector drawing region 105 have been formed, a polycrystal silicon film is formed over the whole surface. After transforming the polycrystalline silicon film into a P⁺-type polycrystalline silicon film by diffusing boron, the BSG film is removed. After forming a titanium film over the whole surface by sputtering, a titanium silicide film is formed by heat treatment. The laminated film is then patterned, thereby forming a base drawing electrode comprising the P⁺-type polycrystalline silicon film 111a and the titanium silicide film 116.

What is claimed is:

1. A semiconductor device, comprising:

a single crystal silicon substrate of one conduction type, which has selectively on its surface a buried layer of reverse conduction type, at least part of the top surface of which is covered by a silicon epitaxial layer of reverse conduction type;

a first silicon oxide film which is provided on the surface of said single crystal silicon substrate and which has a first opening which reaches said silicon epitaxial layer;

a silicon nitride film which is provided on the surface of said first silicon oxide film, and which has a second opening which is connected to said first opening and is of a form enclosing said first opening;

a second silicon oxide film which is provided on said silicon nitride film, and which has a third opening which is connected to said second opening and has substantially the same shape as said first opening;

a base drawing electrode which is provided on the surface of said second silicon oxide film at least in the vicinity of said third opening, which base drawing electrode has a protrusion of a prescribed width extending from an end of said third opening and has a fourth opening of a form such that said fourth opening is enclosed by said third opening, at least a bottom layer of said base drawing electrode comprises a first polycrystalline semiconductor film of one conduction type;

a third silicon oxide film which directly covers said base drawing electrode and which has said fourth opening;

a first spacer comprising a fourth silicon oxide film which directly covers a side surface of said third silicon oxide film and a side surface of said base drawing electrode, which constitute a side wall of said fourth opening;

a second polycrystalline semiconductor film of one conduction type, which is provided inside said second opening with a prescribed width, which said second polycrystalline semiconductor film directly covers a lower surface of said second silicon oxide film and a top surface of said first silicon oxide film which are exposed by said second opening, and which said second polycrystalline semiconductor film directly covers a side surface of said silicon nitride film constituting a side wall of said second opening;

a third polycrystalline semiconductor film of one conduction type, which is connected directly to a lower surface of said first polycrystalline semiconductor film which is exposed by said third opening, which said third polycrystalline semiconductor film directly covers a side surface of said second silicon oxide film constituting a side wall of said third opening, and which is directly connected to a top surface of said second polycrystalline semiconductor film which is exposed by said third opening, and part of a side surface of said second polycrystalline semiconductor film which is exposed inside said second opening;

a first single crystal semiconductor layer of one conduction type, which is directly connected to a top surface of said silicon epitaxial layer which is exposed by said first opening, which said first single crystal semiconductor layer is directly connected to at least a lower surface of said third polycrystalline semiconductor film and to said second polycrystalline semiconductor film, and which fills at least part of said first opening;

a second spacer comprising a fifth silicon oxide film which directly covers at least part of a side surface of said first spacer, a lower surface of said first spacer which is exposed by said third opening, and a side surface of said third polycrystalline semiconductor film which is exposed at least inside said second opening and said third opening, and which second spacer directly covers part of a top surface of said first single crystal semiconductor layer which is exposed inside said second opening; and a second single crystal semiconductor layer of reverse conduction type which directly covers at least part of a side surface of said second spacer and which is directly connected to the top surface of said first single crystal semiconductor layer which is not covered by said second spacer.

2. The semiconductor device as set forth in claim 1, wherein said first and second single crystal semiconductor layers and said first, second and third polycrystalline semiconductor films are made of silicon.

3. The semiconductor device as set forth in claim 1, wherein said second single crystal semiconductor layer and said first and second polycrystalline semiconductor films are made of silicon, and said first single crystal semiconductor layer and said third polycrystalline semiconductor film are made of silicon-germanium.

4. The semiconductor device as set forth in claim 1, wherein said base drawing electrode comprises said first polycrystalline semiconductor film and a high melting point metal silicide film which is directly connected to the top surface of said first polycrystalline semiconductor film.

5. The semiconductor device as set forth in claim 2, wherein said base drawing electrode comprises said first polycrystalline semiconductor film and a high melting point metal silicide film which is directly connected to the top surface of said first polycrystalline semiconductor film.

6. The semiconductor device as set forth in claim 3, wherein said base drawing electrode comprises said first polycrystalline semiconductor film and a high melting point metal silicide film which is directly connected to the top surface of said first polycrystalline semiconductor film.

7. A semiconductor device, comprising:

a single crystal silicon substrate of one conduction type, which has selectively on its surface a buried layer of reverse conduction type, at least part of the surface of which is covered by a silicon epitaxial layer of reverse conduction type;

a first silicon oxide film which is provided on the surface of said single crystal silicon substrate and which has at its bottom surface a first opening which reaches said silicon epitaxial layer and has at its top surface a second opening which is connected to said first opening and has a form enclosing said first opening;

a silicon nitride film which is provided on the top surface of said first silicon oxide film and which has a third opening which is connected to said second opening and has a form such that it is enclosed by said second opening;

a second silicon oxide film which is provided on a surface of said silicon nitride film and which has a fourth opening which is connected to said third opening and has substantially the same shape as said second opening;

a base drawing electrode which is provided on a surface of said second silicon oxide film at least in the vicinity of said fourth opening, which base drawing electrode has a protrusion of a prescribed width extending from an end of said fourth opening and has a fifth opening of a form such that said fifth opening is enclosed by said third opening, at least a bottom layer of said base drawing electrode comprises a first polycrystalline semiconductor film of one conduction type;

a third silicon oxide film which directly covers said base drawing electrode and which has said fifth opening;

a first spacer comprising a fourth silicon oxide film which directly covers a side surface of said third silicon oxide film and a side surface of said base drawing electrode, which constitute a side wall of said fifth opening;

a second polycrystalline semiconductor film of one conduction type, which is provided inside said second, said third and said fourth openings immediately below a lower surface of said first polycrystalline semiconductor film which is exposed by said fourth opening, and which second polycrystalline semiconductor film directly covers the top surface and a side surface of said first silicon oxide film which is exposed by said second opening, and a lower surface of said silicon nitride film, and a side surface of said silicon nitride film constituting a side wall of said third opening, and a top surface of said silicon nitride film which is exposed by said fourth opening, and a side surface of said second silicon oxide film constituting a side wall of said fourth opening, and which said second polycrystalline semiconductor film is directly connected to the lower surface of said first polycrystalline semiconductor film which is exposed by said fourth opening;

a third polycrystalline semiconductor film of one conduction type, which directly covers part of the side surface of said first silicon oxide film constituting a side wall of said first opening and at least part of a lower surface of said first spacer, and which third polycrystalline semiconductor film is directly connected to a side surface of said second polycrystalline semiconductor film and a lower surface of said second polycrystalline semiconductor film which is exposed by said first opening;

a first single crystal semiconductor layer of one conduction type, which is directly connected to a lower surface of said third polycrystalline semiconductor film and a top surface of said silicon epitaxial layer which is exposed by said first opening, and which first single crystal semiconductor layer fills part of said first opening;

a second spacer comprising a fifth silicon oxide film which directly covers at least part of a side surface of said first spacer, a lower surface of said first spacer which is exposed by said fourth opening and is not covered by said third polycrystalline semiconductor film, a side surface of said third polycrystalline semiconductor film, and part of a top surface of said first single crystal semiconductor layer which is exposed inside said first opening; and a second single crystal semiconductor layer of reverse conduction type which directly covers at least part of a side surface of said second spacer and which is directly connected to the top surface of said first single crystal semiconductor layer which is exposed inside said first opening and is not covered by said second spacer.

8. The semiconductor device as set forth in claim 7, wherein said first and second single crystal semiconductor layers and said first, second and third polycrystalline semiconductor films are made of silicon.

9. The semiconductor device as set forth in claim 7, wherein said second single crystal semiconductor layer and said first and second polycrystalline semiconductor films are made of silicon, and said first single crystal semiconductor layer and said third polycrystalline semiconductor film are made of silicon-germanium.

10. The semiconductor device as set forth in claim 7, wherein said base drawing electrode comprises said first polycrystalline semiconductor film and a high melting point metal silicide film which is directly connected to a top surface of said first polycrystalline semiconductor film.

11. The semiconductor device as set forth in claim 8, wherein said base drawing electrode comprises said first polycrystalline semiconductor film and a high melting point metal silicide film which is directly connected to a top surface of said first polycrystalline semiconductor film.

12. The semiconductor device as set forth in claim 9, wherein said base drawing electrode comprises said first polycrystalline semiconductor film and a high melting point metal silicide film which is directly connected to a top surface of said first polycrystalline semiconductor film.

* * * * *